(12) United States Patent
Munguia et al.

(10) Patent No.: US 10,424,929 B2
(45) Date of Patent: Sep. 24, 2019

(54) TRANSFORMERS WITH MULTI-TURN PRIMARY WINDINGS FOR DYNAMIC POWER FLOW CONTROL

(71) Applicant: Smart Wires Inc., Union City, CA (US)

(72) Inventors: David Munguia, San Jose, CA (US); Amrit Iyer, San Leandro, CA (US); Haroon Inam, San Jose, CA (US); Joe Carrow, Oakland, CA (US); Debrup Das, Union City, CA (US); Arthur Kelley, Napa, CA (US); Ali Farahani, Orange, CA (US)

(73) Assignee: Smart Wires Inc., Union City, CA (US)

( * ) Notice: Subject to any disclaimer, the term of this patent is extended or adjusted under 35 U.S.C. 154(b) by 0 days.

(21) Appl. No.: 15/975,373

(22) Filed: May 9, 2018

(65) Prior Publication Data

US 2018/0262006 A1 Sep. 13, 2018

Related U.S. Application Data

(62) Division of application No. 15/055,422, filed on Feb. 26, 2016.

(Continued)

(51) Int. Cl.
*H02J 3/18* (2006.01)
*H01F 27/28* (2006.01)
(Continued)

(52) U.S. Cl.
CPC ............ *H02J 3/18* (2013.01); *H01F 27/2823* (2013.01); *H01F 27/29* (2013.01); *H02J 3/1807* (2013.01);
(Continued)

(58) Field of Classification Search
None
See application file for complete search history.

(56) References Cited

U.S. PATENT DOCUMENTS

| 2,237,812 A | 4/1941 | De Blieux |
| 2,551,841 A | 5/1951 | Kepple et al. |

(Continued)

FOREIGN PATENT DOCUMENTS

| CH | 660094 | 3/1987 |
| CN | 103256337 | 8/2013 |

(Continued)

OTHER PUBLICATIONS

"International Search Report and Written Opinion of the International Searching Authority dated Feb. 2, 2017; International Application No. PCT/US2016/062358", dated Feb. 2, 2017.

(Continued)

*Primary Examiner* — Thienvu V Tran
*Assistant Examiner* — David M Stables
(74) *Attorney, Agent, or Firm* — Womble Bond Dickinson (US) LLP (57) ABSTRACT

Active impedance-injection module enabled for distributed power flow control of high-voltage (HV) transmission lines is disclosed. The module uses transformers with multi-turn primary windings, series-connected to high-voltage power lines, to dynamically control power flow on those power lines. The insertion of the transformer multi-turn primary is by cutting the line and splicing the two ends of the winding to the ends of the cut high-voltage transmission line. The secondary winding of the transformer is connected to a control circuit and a converter/inverter circuit that is able to generate inductive and capacitive impedance based on the status of the transmission line. The module operates by extracting power from the HV transmission line with the (Continued)

module floating at the HV transmission-line potential. High-voltage insulators are typically used to suspend the module from transmission towers, or intermediate support structures. It may also be directly suspended from the HV transmission line.

11 Claims, 7 Drawing Sheets

Related U.S. Application Data (60) Provisional application No. 62/264,739, filed on Dec. 8, 2015.

(51) Int. Cl.
   *H01F 27/29* (2006.01)
   *H05K 7/14* (2006.01)
   *H02J 3/26* (2006.01)

(52) U.S. Cl.
   CPC .............. *H02J 3/26* (2013.01); *H05K 7/14* (2013.01); *Y02E 40/50* (2013.01)

(56) References Cited

U.S. PATENT DOCUMENTS

| | | |
|---|---|---|
| 3,556,310 A | 1/1971 | Loukotsky |
| 3,704,001 A | 11/1972 | Sloop |
| 3,750,992 A | 8/1973 | Johnson |
| 3,913,003 A | 10/1975 | Felkel |
| 4,025,824 A | 5/1977 | Cheatham |
| 4,057,736 A | 11/1977 | Jeppson |
| 4,103,853 A | 8/1978 | Bannan |
| 4,164,345 A | 8/1979 | Arnold et al. |
| 4,200,899 A | 4/1980 | Volman et al. |
| 4,277,639 A | 7/1981 | Olsson |
| 4,286,207 A | 8/1981 | Spreadbury et al. |
| 4,323,722 A | 4/1982 | Winkelman |
| 4,367,512 A | 1/1983 | Fujita |
| 4,514,950 A | 5/1985 | Goodson, Jr. |
| 4,562,360 A | 12/1985 | Fujimoto |
| 4,577,826 A | 3/1986 | Bergstrom et al. |
| 4,710,850 A | 12/1987 | Jahn et al. |
| 4,821,138 A | 4/1989 | Nakano et al. |
| 4,903,927 A | 2/1990 | Farmer |
| 5,006,846 A | 4/1991 | Granville et al. |
| 5,023,768 A | 6/1991 | Collier |
| 5,032,738 A | 7/1991 | Vithayathil |
| 5,193,774 A | 3/1993 | Rogers |
| 5,461,300 A | 10/1995 | Kappenman |
| 5,469,044 A | 11/1995 | Gyugyi et al. |
| 5,513,061 A | 4/1996 | Gelbien et al. |
| 5,610,501 A | 3/1997 | Nelson et al. |
| 5,648,888 A | 7/1997 | Le Francois et al. |
| 5,844,462 A | 12/1998 | Rapoport et al. |
| 5,884,886 A | 3/1999 | Hageli |
| 5,886,888 A | 3/1999 | Akamatsu et al. |
| 5,986,617 A | 11/1999 | McLellan |
| 6,088,249 A | 7/2000 | Adamson |
| 6,134,105 A | 10/2000 | Lueker |
| 6,147,581 A | 11/2000 | Rancourt et al. |
| 6,215,653 B1 | 4/2001 | Cochran et al. |
| 6,233,137 B1 | 5/2001 | Kolos et al. |
| 6,335,613 B1 | 1/2002 | Sen et al. |
| 6,486,569 B2 | 11/2002 | Couture |
| 6,727,604 B2 | 4/2004 | Couture |
| 6,831,377 B2 | 12/2004 | Yampolsky et al. |
| 6,895,373 B2 | 5/2005 | Garcia et al. |
| 6,914,195 B2 | 7/2005 | Archambault et al. |
| 7,090,176 B2 | 8/2006 | Chavot et al. |
| 7,091,703 B2 | 8/2006 | Folts et al. |
| 7,105,952 B2 | 9/2006 | Divan et al. |
| 7,193,338 B2 | 3/2007 | Ghali |
| 7,352,564 B2 | 4/2008 | Courtney |
| 7,460,931 B2 | 12/2008 | Jacobson |
| 7,642,757 B2 | 1/2010 | Yoon et al. |
| 7,688,043 B2 | 3/2010 | Toki et al. |
| 7,834,736 B1 | 11/2010 | Johnson et al. |
| 7,835,128 B2 | 11/2010 | Divan et al. |
| 7,932,621 B1 | 4/2011 | Spellman |
| 8,019,484 B2 | 9/2011 | Korba et al. |
| 8,249,836 B2 | 8/2012 | Yoon et al. |
| 8,270,558 B2 | 9/2012 | Dielissen |
| 8,310,099 B2 | 11/2012 | Engel et al. |
| 8,401,709 B2 | 3/2013 | Cherian et al. |
| 8,441,778 B1 | 5/2013 | Ashmore |
| 8,497,592 B1 | 7/2013 | Jones |
| 8,680,720 B2 | 3/2014 | Schauder et al. |
| 8,681,479 B2 | 3/2014 | Englert et al. |
| 8,816,527 B1 | 8/2014 | Ramsay et al. |
| 8,825,218 B2 | 9/2014 | Cherian et al. |
| 8,867,244 B2 | 10/2014 | Trainer et al. |
| 8,872,366 B2 | 10/2014 | Campion et al. |
| 8,890,373 B2 | 11/2014 | Savolainen et al. |
| 8,896,988 B2 | 11/2014 | Subbaiahthever et al. |
| 8,922,038 B2 | 12/2014 | Bywaters et al. |
| 8,957,752 B2 | 2/2015 | Sharma et al. |
| 8,996,183 B2 | 3/2015 | Forbes, Jr. |
| 9,099,893 B2 | 8/2015 | Schmiegel et al. |
| 9,124,100 B2 | 9/2015 | Ukai et al. |
| 9,124,138 B2 | 9/2015 | Mori et al. |
| 9,130,458 B2 | 9/2015 | Crookes et al. |
| 9,172,246 B2 | 10/2015 | Ramsay et al. |
| 9,178,456 B2 | 11/2015 | Smith et al. |
| 9,185,000 B2 | 11/2015 | Mabilleau et al. |
| 9,207,698 B2 | 12/2015 | Forbes, Jr. |
| 9,217,762 B2 | 12/2015 | Kreikebaum et al. |
| 9,246,325 B2 | 1/2016 | Coca Figuerola et al. |
| 9,325,173 B2 | 4/2016 | Varma et al. |
| 9,331,482 B2 | 5/2016 | Huang |
| 9,563,218 B2 | 2/2017 | Hall et al. |
| 9,659,114 B2 | 5/2017 | He et al. |
| 9,843,176 B2 | 12/2017 | Gibson et al. |
| 2002/0005668 A1 | 1/2002 | Couture |
| 2002/0042696 A1 | 4/2002 | Garcia et al. |
| 2003/0006652 A1 | 1/2003 | Couture |
| 2003/0098768 A1 | 5/2003 | Hoffmann et al. |
| 2004/0153215 A1 | 8/2004 | Kearney et al. |
| 2004/0217836 A1 | 11/2004 | Archambault et al. |
| 2005/0052801 A1 | 3/2005 | Ghali |
| 2005/0073200 A1* | 4/2005 | Divan .................. H01F 30/16 307/44 |
| 2005/0194944 A1 | 9/2005 | Folts et al. |
| 2005/0205726 A1 | 9/2005 | Chavot et al. |
| 2006/0085097 A1 | 4/2006 | Courtney |
| 2007/0135972 A1 | 6/2007 | Jacobson |
| 2007/0250217 A1 | 10/2007 | Yoon et al. |
| 2008/0103737 A1 | 5/2008 | Yoon et al. |
| 2008/0157728 A1 | 7/2008 | Toki et al. |
| 2008/0177425 A1 | 7/2008 | Korba et al. |
| 2008/0278976 A1 | 11/2008 | Schneider et al. |
| 2008/0310069 A1 | 12/2008 | Divan et al. |
| 2009/0243876 A1 | 10/2009 | Lilien et al. |
| 2009/0281679 A1 | 11/2009 | Taft et al. |
| 2010/0026275 A1 | 2/2010 | Walton |
| 2010/0177450 A1 | 7/2010 | Holcomb et al. |
| 2010/0213765 A1 | 8/2010 | Engel et al. |
| 2010/0302744 A1 | 12/2010 | Englert et al. |
| 2011/0060474 A1 | 3/2011 | Schmiegel et al. |
| 2011/0095162 A1 | 4/2011 | Parduhn et al. |
| 2011/0106321 A1 | 5/2011 | Cherian et al. |
| 2011/0172837 A1 | 7/2011 | Forbes, Jr. |
| 2012/0105023 A1 | 5/2012 | Schauder et al. |
| 2012/0146335 A1 | 6/2012 | Bywaters et al. |
| 2012/0205981 A1 | 8/2012 | Varma et al. |
| 2012/0242150 A1 | 9/2012 | Ukai et al. |
| 2012/0255920 A1 | 10/2012 | Shaw et al. |
| 2012/0293920 A1 | 11/2012 | Subbaiahthever et al. |
| 2013/0002032 A1 | 1/2013 | Mori et al. |
| 2013/0033103 A1 | 2/2013 | McJunkin et al. |
| 2013/0044407 A1 | 2/2013 | Byeon et al. |
| 2013/0094264 A1 | 4/2013 | Crookes et al. |
| 2013/0128636 A1 | 5/2013 | Trainer et al. |

(56) References Cited

U.S. PATENT DOCUMENTS

| | | | |
|---|---|---|---|
| 2013/0166085 | A1 | 6/2013 | Cherian et al. |
| 2013/0169044 | A1 | 7/2013 | Stinessen et al. |
| 2013/0182355 | A1 | 7/2013 | Coca Figuerola et al. |
| 2013/0184894 | A1 | 7/2013 | Sakuma et al. |
| 2013/0200617 | A1 | 8/2013 | Smith et al. |
| 2013/0249321 | A1 | 9/2013 | Gao et al. |
| 2013/0277082 | A1 | 10/2013 | Hyde et al. |
| 2013/0345888 | A1 | 12/2013 | Forbes, Jr. |
| 2014/0008982 | A1 | 1/2014 | Powell et al. |
| 2014/0025217 | A1 | 1/2014 | Jin et al. |
| 2014/0032000 | A1 | 1/2014 | Chandrashekhara et al. |
| 2014/0111297 | A1 | 4/2014 | Earhart et al. |
| 2014/0129195 | A1 | 5/2014 | He et al. |
| 2014/0132229 | A1 | 5/2014 | Huang |
| 2014/0153383 | A1 | 6/2014 | Mabilleau et al. |
| 2014/0188689 | A1 | 7/2014 | Kalsi et al. |
| 2014/0203640 | A1 | 7/2014 | Stinessen |
| 2014/0210213 | A1 | 7/2014 | Campion et al. |
| 2014/0246914 | A1 | 9/2014 | Chopra et al. |
| 2014/0247554 | A1 | 9/2014 | Sharma et al. |
| 2014/0266288 | A1 | 9/2014 | Trabacchin et al. |
| 2014/0268458 | A1 | 9/2014 | Luciani et al. |
| 2014/0312859 | A1 | 10/2014 | Ramsay et al. |
| 2014/0327305 | A1 | 11/2014 | Ramsay et al. |
| 2014/0347158 | A1 | 11/2014 | Goeke et al. |
| 2015/0012146 | A1 | 1/2015 | Cherian et al. |
| 2015/0029764 | A1 | 1/2015 | Peng |
| 2015/0051744 | A1 | 2/2015 | Mitra |
| 2015/0184415 | A1 | 7/2015 | Bushore |
| 2015/0226772 | A1 | 8/2015 | Kreikebaum et al. |
| 2015/0244307 | A1 | 8/2015 | Cameron |
| 2015/0270689 | A1 | 9/2015 | Gibson et al. |
| 2016/0036231 | A1 | 2/2016 | Ramsay et al. |
| 2016/0036341 | A1 | 2/2016 | Jang et al. |
| 2017/0163036 | A1 | 6/2017 | Munguia et al. |
| 2017/0169928 | A1 | 6/2017 | Carrow et al. |

FOREIGN PATENT DOCUMENTS

| | | |
|---|---|---|
| CN | 203668968 | 6/2014 |
| JP | 2002-199563 | 7/2002 |
| JP | 2005-045888 | 2/2005 |
| JP | 2015-086692 | 5/2015 |
| KR | 10-1053514 | 8/2011 |
| WO | WO-2008/082820 | 7/2008 |
| WO | WO-2014/035881 | 3/2014 |
| WO | WO-2014/074956 | 5/2014 |
| WO | WO-2014/099876 | 6/2014 |
| WO | WO-2015/074538 | 5/2015 |
| WO | WO-2015/119789 | 8/2015 |

OTHER PUBLICATIONS

"International Search Report and Written Opinion of the International Searching Authority dated Feb. 2, 2017; International Application No. PCT/US2016/062620", dated Feb. 2, 2017.

"International Search Report and Written Opinion of the International Searching Authority dated Mar. 2, 2017; International Application No. PCT/US2016/061009", dated Mar. 2, 2017.

"Invitation of the International Searching Authority to Pay Additional Fees dated Dec. 15, 2016; International Application No. PCT/US2016/061009", Dec. 15, 2016.

"Notice of Allowance dated Feb. 22, 2018; U.S. Appl. No. 15/069,785", Feb. 22, 2018.

"Office Action dated Apr. 6, 2018; U.S. Appl. No. 15/055,422", Apr. 6, 2018.

"Office Action dated Apr. 6, 2018; U.S. Appl. No. 15/157,726", dated Apr. 6, 2018.

"Office Action dated Feb. 9, 2018; U.S. Appl. No. 15/345,065", Feb. 9, 2018.

"Office Action dated Jul. 26, 2017; U.S. Appl. No. 15/069,785", Jul. 26, 2017.

"Office Action dated Nov. 3, 2017; U.S. Appl. No. 15/157,726", Nov. 3, 2017.

Amin, S. M. et al., "Toward a Smart Grid: Power Delivery for the 21st Century", IEEE power & energy magazine, vol. 3, No. 5, Sep./Oct. 2005, pp. 34-41.

Angeladas, Emmanouil , "High Voltage Substations Overview (part 1)", Siemens, Jan. 24, 2013, pp. 1-8.

Aquino-Lugo, Angela A. , "Distributed and Decentralized Control of the Power Grid", Ph.D. Dissertation, University of Illinois at Urbana-Champaign, 2010, 172 pp. total.

Dash, P. K. et al., "Digital Protection of Power Transmission Lines in the Presence of Series Connected FACTS Devices", IEEE Power Engineering Society Winter Meeting, 2000, pp. 1967-1972.

Divan, D. M. , "Nondissipative Switched Networks for High-Power Applications", Electronics Letters, vol. 20, No. 7, Mar. 29, 1984, pp. 277-279.

Funato, Hirohito et al., "Realization of Negative Inductance Using Variable Active-Passive Reactance (VAPAR)", IEEE Transactions on Power Electronics, vol. 12, No. 4, Jul. 1997, pp. 589-596.

Gyugyi, Laszlo et al., "Status Synchronous Series Compensator: A Solid-State Approach to the Series Compensation of Transmission Lines", IEEE Transactions on Power Delivery, vol. 12, No. 1, Jan. 1997, pp. 406-417.

Gyugyi, Laszlo et al., "The Interline Power Flow Controller Concept: A New Approach to Power Flow Management in Transmission Systems", IEEE Transactions on Power Delivery, vol. 14, No. 3, Jul. 1999, pp. 1115-1123.

Kavitha, M. et al., "Integration of FACTS into Energy Storage Systems for Future Power Systems Applications", International Journal of Advanced Research in Electrical, Electronics and Instrumentation Engineering, vol. 2, Issue 2, Feb. 2013, pp. 800-810.

Kumbhar, Mahesh M. et al., "Smart Grid: Advanced Electricity Distribution Network", IOSR Journal of Engineering (IOSRJEN), vol. 2, Issue 6, Jun. 2012, pp. 23-29.

Lambert, Frank C. , "Power Flow Control", ISGT Europe, 2014, Istanbul, Turkey, Oct. 13, 2014, pp. 1-15.

Lehmkoster, Carsten , "Security Constrained Optimal Power Flow for an Economical Operation of FACTS-Devices in Liberalized Energy Markets", IEEE Transactions on Power Delivery, vol. 17, No. 2, Apr. 2002, pp. 603-608.

Mali, Bhairavanath N. et al., "Performance Study of Transmission Line Ferranti Effect and Fault Simulation Model Using MATLAB", International Journal of Innovative Research in Electrical, Electronics, Instrumentation and Control Engineering, vol. 4, Issue 4, Apr. 2016, pp. 49-52.

Mutale, Joseph et al., "Transmission Network Reinforcement Versus Facts: An Economic Assessment", IEEE Transactions on Power Systems, vol. 15, No. 3, Aug. 2000, pp. 961-967.

Ramchurn, Sarvapali D. et al., "Putting the 'Smarts' into the Smart Grid: A Grand Challenge for Artificial Intelligence", Communications of the ACM, vol. 55, No. 4, Apr. 2012, pp. 86-97.

Reddy, D. M. et al., "FACTS Controllers Implementation in Energy Storage Systems for Advanced Power Electronic Applications—A Solution", American Journal of Sustainable Cities and Society, Issue 2, vol. 1, Jan. 2013, pp. 36-63.

Renz, B. A. et al., "AEP Unified Power Flow Controller Performance", IEEE Transactions on Power Delivery, vol. 14, No. 4, Oct. 1999, pp. 1374-1381.

Ribeiro, P. et al., "Energy Storage Systems", Chapters 1-2.4 of Section entitled "Energy Storage Systems" in Electrical Engineering—vol. III, edited by Kit Po Wong, Encyclopedia of Life Support Systems (EOLSS) Publications, Dec. 13, 2009, 11 pp. total.

Schauder, C. D. et al., "Operation of the Unified Power Flow Controller (UPFC) Under Practical Constraints", IEEE Transactions on Power Delivery, vol. 13, No. 2, Apr. 1998, pp. 630-639.

Siemens Sas, "Portable Power Solutions, "Plug and play" High Voltage E-Houses, skids and mobile high voltage substations up to 420 kV", Nov. 2015, 8 pp. total.

Swain, S. C. et al., "Design of Static Synchronous Series Compensator Based Damping Controller Employing Real Coded Genetic Algorithm", International Journal of Electrical, Computer, Energetic, Electronic and Communication Engineering, vol. 5, No. 3, 2011, pp. 399-407.

(56) References Cited

OTHER PUBLICATIONS

Xue, Yiyan et al., "Charging Current in Long Lines and High-Voltage Cables—Protection Application Considerations", 67th Annual Georgia Tech Protective Relaying Conference, Atlanta, Georgia, May 8-10, 2013, pp. 1-17.

"Notice of Allowance dated Dec. 31, 2018; U.S. Appl. No. 15/981,616", Dec. 31, 2018.

"Office Action dated Jan. 14, 2019; U.S. Appl. No. 16/002,993", Jan. 14, 2019.

"Notice of Allowance dated Sep. 24, 2018; U.S. Appl. No. 15/157,726", Sep. 24, 2018.

"Notice of Allowance dated Sep. 4, 2018; U.S. Appl. No. 15/345,065", Sep. 4, 2018.

"Office Action dated Jul. 27, 2018; U.S. Appl. No. 15/055,422", Jul. 27, 2018.

Albasri, Fadhel A. et al., "Performance Comparison of Distance Protection Schemes for Shung-FACTS Compensated Transmission Lines", IEEE Transactions on Power Delivery, vol. 22, No. 4, Oct. 2007, pp. 2116-2125.

Bhaskar, M. A. et al., "Impact of FACTS devices on distance protection in Transmission System", 2014 IEEE National Conference on Emerging Trends in New & Renewable Energy Sources and Energy Management (NCET NRES EM), Dec. 16, 2014, pp. 52-58.

Samantaray, S. R., "A Data-Mining Model for Protection of FACTS-Based Transmission Line", IEEE Transactions on Power Delivery, vol. 28, No. 2, Apr. 2013, pp. 612-618.

\* cited by examiner

TRANSFORMERS WITH MULTI-TURN PRIMARY WINDINGS FOR DYNAMIC POWER FLOW CONTROL

CROSS-REFERENCE TO RELATED APPLICATIONS

This application is a divisional of U.S. patent application Ser. No. 15/055,422 filed Feb. 26, 2016 which claims the benefit of U.S. Provisional Patent Application No. 62/264,739 filed Dec. 8, 2015, the disclosures of which are incorporated herein by reference.

BACKGROUND OF THE INVENTION

1. Field of the Invention

The present invention relates to systems and methods for dynamic line balancing of high-voltage (HV) transmission lines using spatially distributed active impedance injection modules that are connected directly in series with the HV transmission lines that form the HV electric power grid.

2. Prior Art

HV electric power grids typically operate at voltages that are on the order of about 50 kV up to about 600 kV. One of the requirements of these HV power grids is the need for dynamic distributed active power-flow control capability that can inject both inductive and capacitive impedance on to the HV transmission line as required to achieve line balancing and phase angle correction. A system that can react fast to the problems of power flow over the grid will greatly improve the grid operation and power-transfer efficiency.

Congested networks limit system reliability and increase the cost of power delivery by having part of the power dissipated in unbalanced circuits causing loop currents with associated power loss. In addition, substantially out-of-phase voltages and currents on the transmission lines reduce the capacity of the lines to transfer real power from the generator to the distribution substation. To remove this limitation, it is desired to have HV power grids with transmission lines that are balanced, with power transfer shared substantially per optimization methods, with reasonable power factor, and controllable phase difference between voltage and currents. These improvements reduce the loop currents and associated losses and enable real power transfer over the grid up to the capacity of the lines.

Most of the grid control capabilities today are ground based and installed at substations with switchable inductive and capacitive loads. These installations require high-voltage insulation and high-current switching capabilities. Being at the substations these can use methods of cooling that include oil cooling, forced recirculation of coolant, and other options without consideration of the weight and size of the units. These lumped controls require a centralized data collection and control facility to coordinate operation across the grid and hence have associated delays in implementing the control function on the power grid.

Distributed and active control of transmission line impedance, if effectively implemented with high reliability, improves the system efficiency substantially, but requires cost-effective implementations that can alter the impedance of the HV transmission lines, with fast identification and fast response to line-balance issues, by changing the phase angle of the current-voltage relationship applied across the line, thus controlling power flow.

Figure 1:
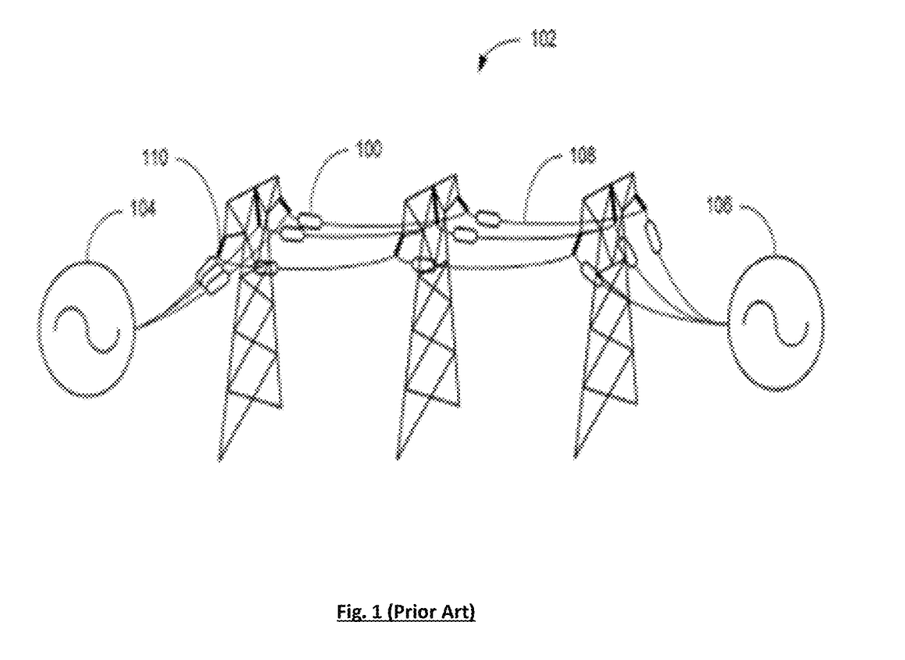
FIG. 1 is a representation of a high voltage transmission line showing distributed passive impedance injection modules attached directly to the HV transmission line. (Prior art)

At present proven effective and reliable solutions for distributed control of the power grid as, for example, described in U.S. Pat. No. 7,835,128 to Divan et al (the '128 patent) are limited. FIG. 1 shows a representation of the present-day distributed line balancing system 102 using a "distributed series reactor (DSR)" 100 using a passive impedance-injection module.

Power is transmitted from the electric power source or generator 104 to the load or distribution substation 106. Spatially distributed passive inductive impedance injection modules or DSR 100) are directly attached to the power conductor on the HV transmission line 108, and hence form the primary winding of the DSR 100 with a secondary winding having a bypass switch that, when open, inject an inductive impedance on to the line for distributed control. These DSR 100s only provide a limited amount of control by injecting only the inductive impedance on to the line. When the secondary winding is shorted by the bypass switch, the DSR 100 is in a protection mode and injects substantially zero impedance on to the HV line.

Figure 2:
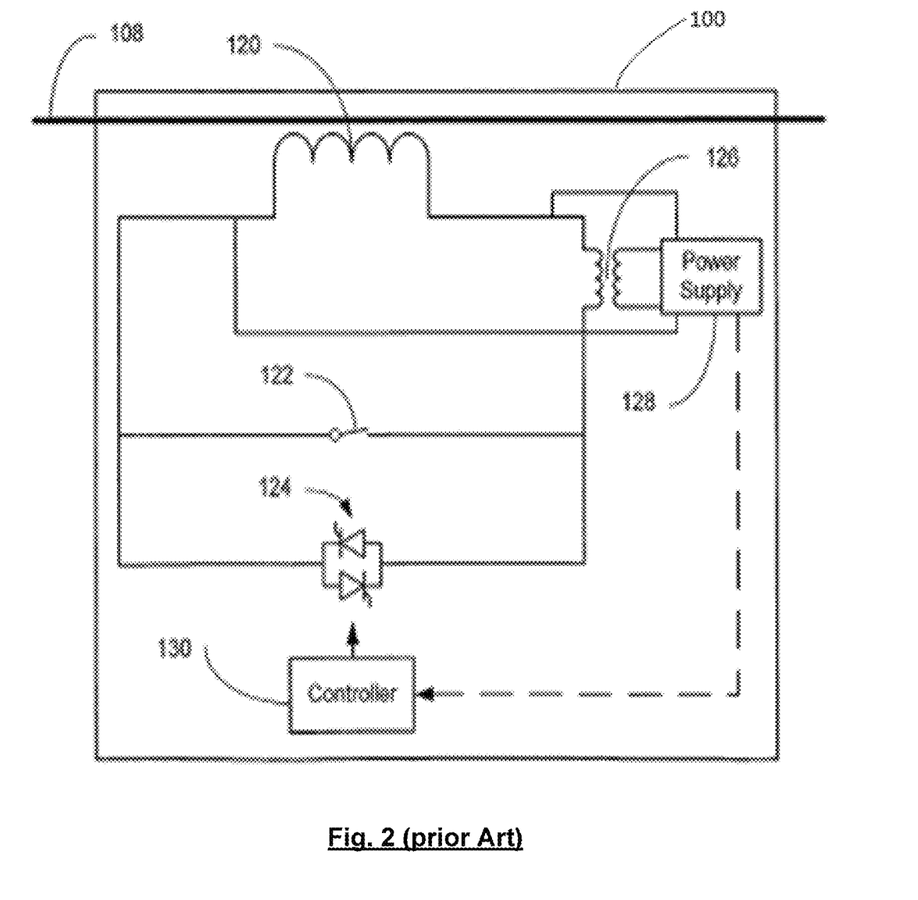
FIG. 2 is an exemplary block diagram 200 of an inductive impedance injection module using a single turn transformer for distributed inductive impedance injection on a HV transmission line. (Prior art)
Figure 2A:
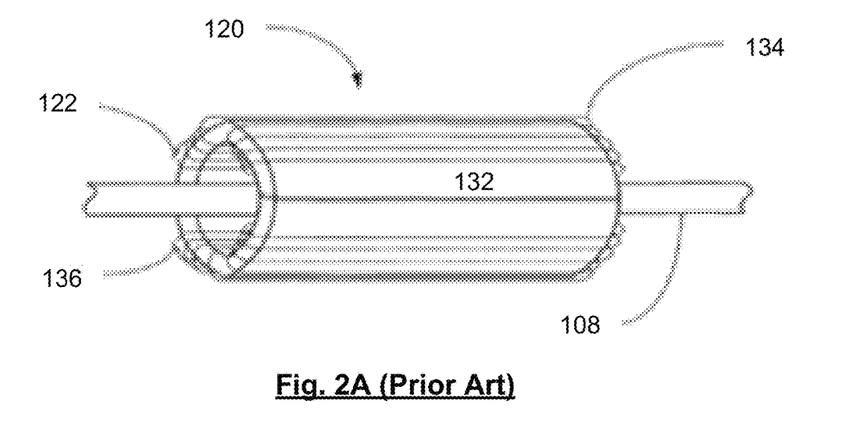
FIGS. 2A and 2B are exemplary schematics of the single turn transformer used in the passive impedance injection module of FIG. 2. (Prior Art)
Figure 2B:
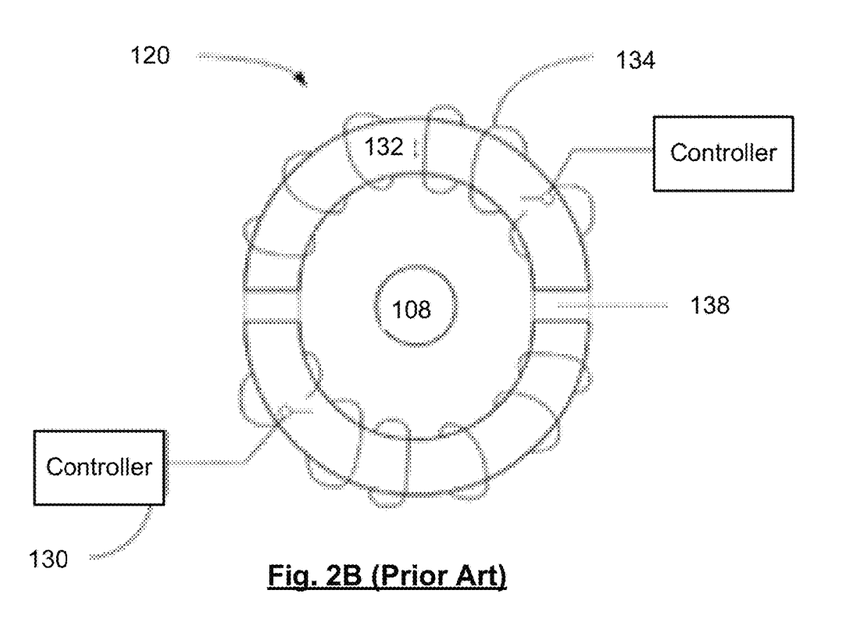

FIGS. 2 and 2A and 2B show embodiments of a passive impedance injection module DSR 100. The HV transmission line 108 is incorporated into the module as the primary winding by adding two split-core sections 132 that are assembled around the HV transmission line 108. The core sections 132 are attached to the HV transmission line 108 with an air gap 138 separating the sections after assembly. The air gap 138 is used to set a maximum value of fixed inductive impedance that is to be injected on the HV line via the primary winding. Secondary winding 134 and 136 encircles the two split-core sections 132 and enables the bypass switch 122 to short out the secondary winding and prevents injection of inductive impedance on to the a HV transmission line 108 and also provides protection to the secondary circuits when power surges occur on the HV transmission line. The split core sections 132 and the windings 134 and 136 comprise the single-turn transformer (STT) 120. A power supply module 128 derives power from the secondary windings 134&136 of the STT 120 either via the series-connected current transformer winding 126 or via the alternate parallel-connected winding. The power supply 128 provides power to a controller 130. The controller 130 monitors the line current via the secondary current of the STT 120, and turns the bypass switch 122 off when the line current reaches and exceeds a predetermined level. With the contact switch 122 open, a thyristor 124 may be used to control the injected inductive impedance to a value up to the maximum set by the air gap 138 of DSR 100.

When using multiple DSRs 100 connected on the HV transmission line as in FIG. 1, the inductive impedance injected by all the DSRs 100 on the line segments provides the total control impedance. The main reason for the choice and use of inductive impedance injection unit DSR 100 is its simplicity, inexpensiveness, and reliability, as it does not need active electronic circuits to generate the needed inductive impedance. The value of the inductive impedance of each DSR 100 is provided by the air-gap setting of the transformer core and not electronically generated, and hence has fewer failure modes than if the same was implemented using electronic circuits. The difficulty in implementing and using electronic circuits for impedance injection units that can produce actively controllable high impedance for injection comprising both inductive and capacitive impedance is multi fold. It includes achieving, the long-term reliability demanded by electric utilities while generating the voltage and current levels, that are needed to achieve effective active control of the lines in the secondary circuit, while remaining within reasonable cost limits for the module.

Figure 3:
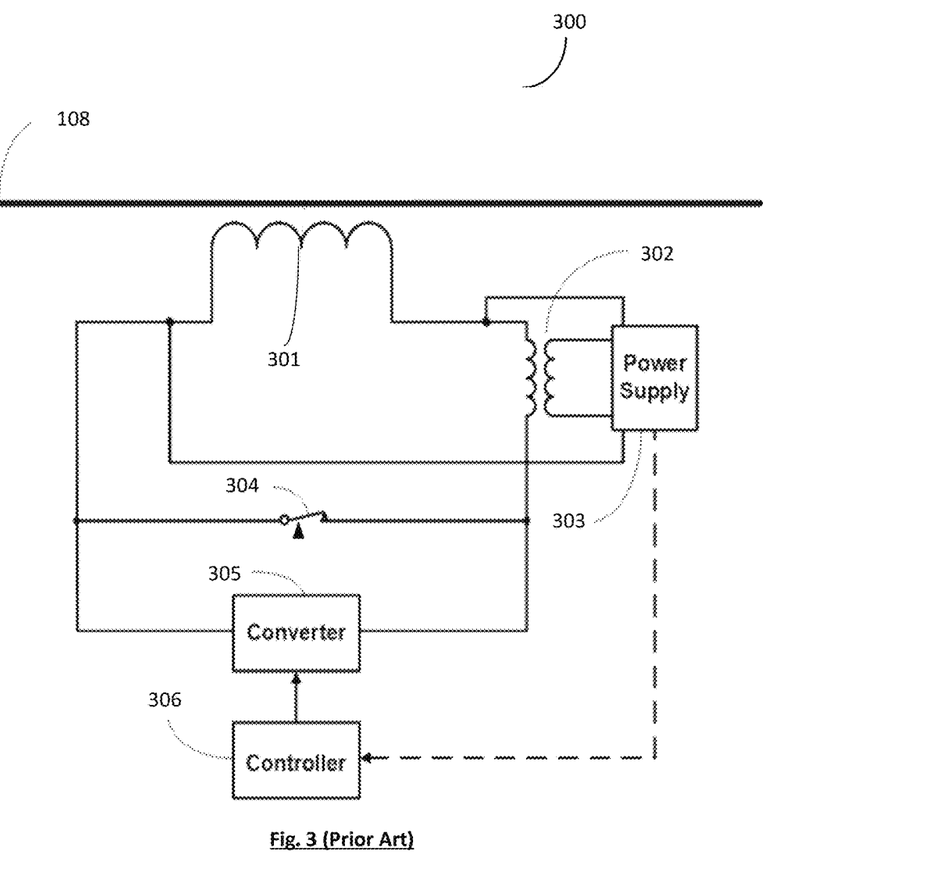
FIG. 3 is an exemplary block diagram 300 of an active impedance injection module, licensed to the current entity, using a single-turn transformer for distributed active impedance injection on to a HV transmission line. (Prior Art)

Distributed active impedance injection modules on high-voltage transmission lines have been proposed in the past. U.S. Pat. No. 7,105,952 of Divan et al. licensed to the applicant entity is an example of such. FIG. 3 shows an exemplary schematic of an active distributed impedance injection module 300. These modules 300 are expected to be installed in the same location on the HV power line as the passive impedance injection modules (or "DSR" 100) shown FIG. 1. The active impedance injection module 300 does not perform the same functions. In fact the active impedance injection module 300 does not have a gapped core 132 of FIG. 2B that provides the fixed inductive impedance. Instead the inductive or capacitive impedance is generated using the converter 305 based on the sensed HV transmission line 108 current. Sampling the secondary current by the series-connected secondary transformer 302 does the sensing of the magnitude of the line current. The sensing and power supply block 303 connected to the secondary transformer 302 extracts the HV transmission-line current information and feeds the controller 306. The controller based on the received input provides the necessary commands to the converter 305 to generate the required inductive or capacitive impedance to adjust the line impedance. The value of the impedance in this case is not fixed but can be made to vary according to the status of the measured current on the HV transmission line. Hence the system using spatially distributed active impedance injection modules 300 provides for a much smoother and efficient method for balancing the grid.

In practice the active impedance injection modules 300s have not been practical due to reasons of cost and reliability. In order to inject the needed impedances on to the HV transmission line for providing reasonable line balancing there is a need to generate a significant amount of power in the converter circuits. This has required the active impedance injection modules 300 to use specialized devices with adequate voltages and currents ratings.

The failure of a module in a spatially distributed inductive-impedance injection-line balancing system using DSR 100 modules inserts a near-zero impedance (equal to the leakage impedance) set by the shorted secondary winding or substantially zero impedance on to the line. Failure of a few modules out of a large number distributed over the HV transmission line does not mandate the immediate shutdown of the line. The repairs or replacement of the failed modules can be undertaken at a time when the line can be brought down with minimum impact on the power flow on the grid. On the other hand, for utilities to implement distributed active line balancing, the individual modules must be extremely reliable. These also have to be cost effective to be accepted by the Utilities.

Power transmission line balancing circuits have been limited to the use of delayed-acting heavy-duty fully-insulated oil-cooled inductive and capacitive impedance injectors or phase-shifting transformers prone to single-point failures, located at substations where repairs of these failed units can be handled with out major impact on power transfer over the grid.

As described above the use the specialized devices that can handle the needed power with high reliability demanded by the utilities at a reasonable cost has not been possible so far. There is a need for such a capability for converting the grid to a more efficient and intelligent system for power distribution. If it can be established, it will have a major impact on the efficiency and capabilities of the grid.

BRIEF DESCRIPTION OF THE DRAWINGS

The drawings are meant only to help distinguish the invention from the prior art. The objects, features and advantages of the invention are detailed in the description taken together with the drawings.

DETAILED DESCRIPTION OF THE PREFERRED EMBODIMENTS

As discussed above there is a need to have high-reliability, fault-tolerant and intelligent distributed dynamic-control modules (distributed active impedance injection modules) with capability to inject both inductance and capacitive impedances of sufficient and appropriate magnitude on to high-voltage transmission lines to enable distributed power flow control. These distributed dynamic control modules are directly attached to the HV-Transmission line and are at line potential while in operation. The distributed dynamic control modules are enabled to operate by extracting power from the HV-Transmission line for control and for generating the necessary voltages to be impressed on the High Voltage (HV) transmission line. The modules generate voltages at the right phase angle for injection on to the HV-transmission line, through the multi-turn transformer, to provide the necessary inductive or capacitive impedance during operation.

The invention disclosed the use of the multi-turn transformer having multi-turn primary winding connected in series with the HV transmission line 108 by cutting and splicing in the winding. The secondary side of the multi-turn transformer and all associated circuitry are electrically isolated from the ground. However, one side of the secondary winding is connected to the primary winding to provide a virtual ground or "floating ground" reference and also partly to protect the secondary-side circuits form stray fields. Alternately the virtual ground 408 can be established by connecting the negative dc link of the inverter/electronic injection module to the HV transmission line. Further, both may be grounded for effective operation. Different power-electronics topologies may necessitate other grounding schemes and these schemes do not effect the key invention but, rather, are specific implementations.

In order for the distributed control modules to be successfully accepted by utilities and installed on lines, these distributed control modules have to be smart and self-aware, remotely controllable and configurable. The modules should be of a reasonable weight compared to the line segment over which these are to be installed, even where the modules are suspended in an insulated fashion from the towers or are supported by additional support structures. These should also have a low wind resistance to reduce the effect of wind loading on the line/tower/special support structure employed. As an essential feature all the electronic components and circuits of the module should have very high reliability to reduce the probability of line down times due to failure of the modules/components used therein. The splicing connection of the module to the HV transmission line also has to have high reliability.

The invention disclosed provides distributed active control having very high reliability and capability for power flow and line balancing across the multiple high-voltage transmission lines used for power transmission on the high power grid system. The invention overcomes the issues of the prior art implementations discussed and meet the criteria set for the use of the distributed control modules that are discussed below.

There are multiple requirements that have been defined for achieving the use of distributed control that need changes from the prior art implementations. These are:
1. The need is to have a distributed module that can generate and supply the required range of inductive and capacitive impedances (generating the necessary leading or lagging power) to the transmission line to provide the necessary control for line balancing.
2. Provide the above capability at a reasonable cost point-preferably by using standard off-the-shelf power-electronics components; this means that the secondary winding and associated circuits operate at voltages and current levels normally seen in high-volume power-electronic applications. Using off-the-shelf power-electronics components means using general-purpose power-electronics components that are also manufactured and sold in the ordinary course of business for other uses.
3. The third is the need for reliability of the distributed modules to be high enough to eliminate failures and related line shut downs to an acceptable level for the Utilities—this is achievable if standard power-electronics components, with associated high reliability can be used in the secondary circuits.
4. The final need is to have relatively low weight and low wind-capture cross section for the module to be attached to the HV-transmission line directly or with minimum extra support.

The disclosed invention provides for improvement in all the above aspects in the embodiments disclosed below:

The prior art dynamic injection modules had problems, which prevented their acceptance. One was the need for specialized components for the generation of the magnitude of injection power (voltage and current) to be generated to provide adequate control of the HV transmission line segment where the module is attached. The second was the lack of reliability due to the modules handling high power levels, which again necessitated specially tested and qualified component use. Both the above requirements resulted in the cost of the module also being very high for use by utilities.

The disclosed invention for increasing the impressed voltage or impedance on the transmission line uses multiple turns on the primary winding of a series-connected injection transformer. Increasing the number of turns in the primary winding alters the turns ratio of the transformer, and allows the distributed active impedance injection module (injection module) to have a greater impact. Since the primary winding of the injection transformer need to be in series with the HV transmission line, the use of additional turns of the primary winding requires the HV transmission line to be cut and the ends of the winding to be spliced in series with the HV transmission line. Further having multiple turns of heavy-duty wire, capable of carrying the line currents seen on the power grid and the use of a heavier core to provide the required coupling/flux linkage to the line, increases the weight and wind-capture cross section of the injection module. Though the injection modules are still attachable directly to the line, it is preferable to provide additional support for the heavier injection modules of the present invention due to its additional weight.

The advantages of the disclosed multi-turn primary transformer include the ability to inject higher voltages, with 90-degree lead or lag angle, providing inductive or capacitive impedances respectively, on to the HV transmission line for power flow control and grid optimization. With more turns, the transformer can also be designed such that the—power-rating-to-weight ratio (kVA per kg) of the unit can be increased, increasing the economy of the unit as well. The use of the multi-turn primary winding also allow the preferred use of non-gapped transformer core, with high-permeability core materials, thereby reducing the flux leakage and improving power transfer between the primary and secondary windings. This, and the careful selection of the number of secondary turns as a ratio of the primary turns, further reduces the dynamic secondary voltages that have to be generated for the required injection of voltages with the correct phase for line balancing. The lower voltage required to be generated across the secondary winding, to achieve the high kVA injection, due to the carefully selected ratio of the primary to secondary windings, enable high-volume power semiconductors and components to be used. The use of these semiconductors and components in the secondary circuit of the transformer (for the control module, the power converter generating the necessary leading or lagging voltages and protection circuits including the shorting switch) make the module very cost-effective. Further the use of lower voltages in the secondary circuits with associated power electronic components with sufficient voltage margins provide the necessary reliability of operation for these circuits connected across the secondary windings to satisfy the reliability requirements of the utilities for use of the distributed modules.

Further using the distributed approach, with the impedance injection modules, allows for significantly greater "N+X" system reliability, where N is the required number of distributed modules, and X is the number of extra redundant modules. Therefore, by ensuring the reliability of each unit by itself being sufficient for use by the utilities, the added extra redundant distributed active-impedance control modules provide an additional layer of "system" reliability over and above the unit reliability. The use of these distributed impedance injection modules also provide the intelligence at the point of impact, for providing fast response to any changes in the optimum characteristics of the lines while transferring power. This in turn results in a grid using distributed injection modules of high reliability, capable of providing very high system reliability, acceptable to all the utilities. The use of the distributed impedance injection modules hence are enabled to provide the best capability to balance the power transmitted over the HV-transmission-lines of the power grid.

Figure 4:
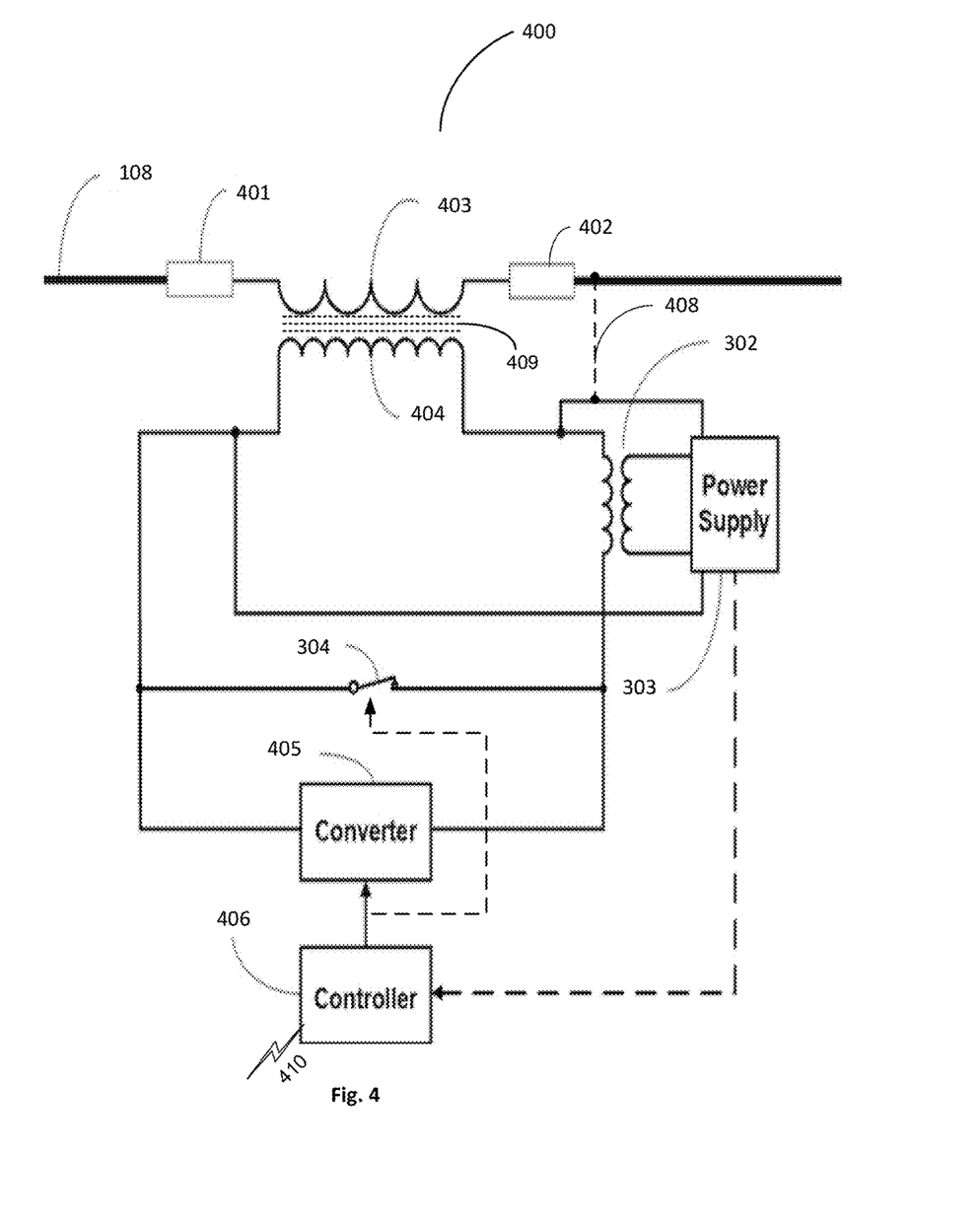
FIG. 4 is an exemplary block diagram 400 of an embodiment of the disclosed active impedance injection module using multi-turn primary windings for distributed active impedance injection on a HV transmission line.
Figure 4A:
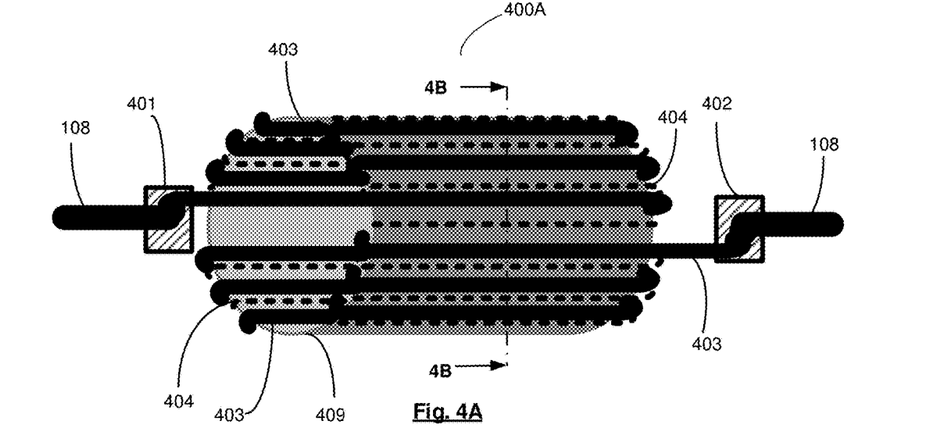
FIG. 4A is an exemplary schematics of the multi-turn primary transformer as per an embodiment of the current invention. The multiple secondary turns are deliberately not shown in order to provide a simpler drawing.
Figure 4B:
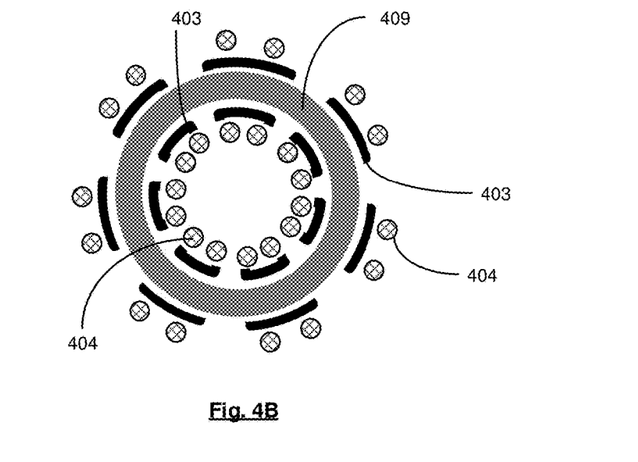
FIG. 4B shows an exemplary cross section of the multi-turn transformer of FIG. 4A.

FIG. 4 is an exemplary block diagram 400 of an implementation of the active impedance injection module (injection module) of the current invention. The injection module 400 comprises a multi-turn transformer 400A that has its primary winding 403 connected directly to the transmission line 108 by breaking the line and attaching the two ends of the primary winding 403, by splicing into the line segment as shown in FIG. 4A at 401 and 402. The primary winding 403, is in series with the HV transmission line, 108 and carries the total current carried by the transmission line, 108. In order to reduce losses due to skin effect in the conductors and thereby reduce the heating of the conductors used in the primary winding, 403 of the multi-turn transformer 400A, a ribbon conductor or continuously transported cable or a braided ribbon conductor may be used, instead of the standard conductor, for the primary winding 403, as shown in the exemplary cross section FIG. 4B of the multi-turn transformer, 400A. The ribbon/braided ribbon conductor when used, also helps to reduce the over all weight of the conductor used and hence reduce the weight of the whole injection module 400. A conductive foil may also be used instead of the standard conductor in some cases to reduce the weight and improve the current carrying capability. A non-gapped transformer core 409, of high permittivity material, is used to allow the maximum coupling possible between the primary winding 403 and the secondary winding 404 of the multi-turn transformer 400A. In this instance it is essential to have the splicing system design to be made robust to withstand the stresses that the splicing system will be subject to in the event of a utility-level fault current and to the normal thermal cycles during daily operation, to minimize the chance that splicing unit 401 and 402 failure will take down the line 108. The secondary winding 404 of the transformer couples to the primary winding 403 and is floating with respect to the primary winding. An exemplary virtual ground at the potential of the HV transmission line 108 is established by connecting one side of the secondary winding of the multi-turn transformer to the HV transmission line that enables the injection module 400 itself to be floating at high voltage of the HV transmission line 108 during operation.

A second low-voltage transformer 302 in the secondary circuit is connected to a power supply 303 within the injector module 400 that generates the necessary power required for the low-voltage electronics comprising the sensing, communication and control circuitry, all of which are lumped in the block diagram of the module as controller 406, the voltage converter 405 and the secondary winding shorting switch 304. The voltage converter or simply converter 405 may be of any appropriate design, as such devices of various designs are well known in the art. Typically such devices are configured to inject an inductive load onto the high voltage transmission line, and may also have the capability of injecting a capacitive load on the transmission for power factor control, and may further be capable of controlling harmonic content in the high-voltage transmission line. Such devices are also known by other names, such as by way of example, inverters or converters/inverters. An exemplary device of this general type is the combination of the inverter 71 and energy storage 74 of U.S. Pat. No. 7,105,952, though many other examples of such devices are well known. These devices typically act as active impedances to controllably impose the desired impedance onto the high-voltage transmission line. Also preferably the controller 410 used in the preferred embodiments includes a transceiver for receiving control signals and reporting on high voltage transmission line conditions, etc.

The shorting switch 304 is activated to prevent damage to the circuits connected across the secondary winding 404 during occurrence of high transients on the HV transmission line due to a short circuit or lightning strikes, or even for prolonged overloads The controller 406 has sensor circuitry for monitoring the status of the line and for triggering the protection circuits 304, and a transceiver establishing a communication capability 410 for inter-link communication and for accepting external configuration and control commands, which are used to provide additional instructions to the converter 406. The voltage converter 405 is an active voltage converter that, based on input from the controller 406, generates the necessary leading or lagging voltages of sufficient magnitude, to be impressed on the secondary winding 404 of the power line transformer of the distributed active impedance injection module 400, to be coupled to the HV transmission line 108 through the series-connected multi-turn primary winding 403 of the transformer. This injected voltage at the appropriate phase angle is able to provide the necessary impedance input capability for balancing the power transfer over the grid in a distributed fashion. The multi-turn primary 403 of the disclosed transformer 400A coupled to the HV-transmission line 108 is hence the main enabler for implementing the active distributed control of the power transfer and balancing of the grid.

The current application addresses the advantages and features of the use of multi-turn secondary windings 403 of a distributed active impedance injection module (injector module) 400 attached to the HV transmission line 108. By using a multi-turn primary winding 403 the multi-turn transformer 400A is able to impress a higher voltage on the power HV transmission line with a given transformer core size and weight while the connected circuits of the secondary winding 404 (converter 405, controller 406 and protection switch 304) of the transformer 400A are able to operate at lower voltage ranges with the proper turns ration selection, that are typical of power-electronics components commercially available. This enables a cost-effective product using standard components and devices while providing the needed high reliability to the modules and high reliability to the grid system. The use of this type of injection module 400 allows fast response to changes in loading of the HV transmission lines at or close to the point of change for dynamic control and balancing of the transmission lines. By providing the capability for injection of sufficiently large inductive and capacitive loads in line segments using reliable distributed injector modules 400, the over all system stability is also improved. The injector module 400 of the current invention is not confined to substations, as in the past, but is enabled to provide power flow control capability within existing utility right-of-way corridors in a distributed fashion. The use of multi-turn primary winding 403 also allows the typical use of non-gapped core for the transformer improving the weight and power transfer coupling of the device to the HV transmission line 108.

Figure 5:
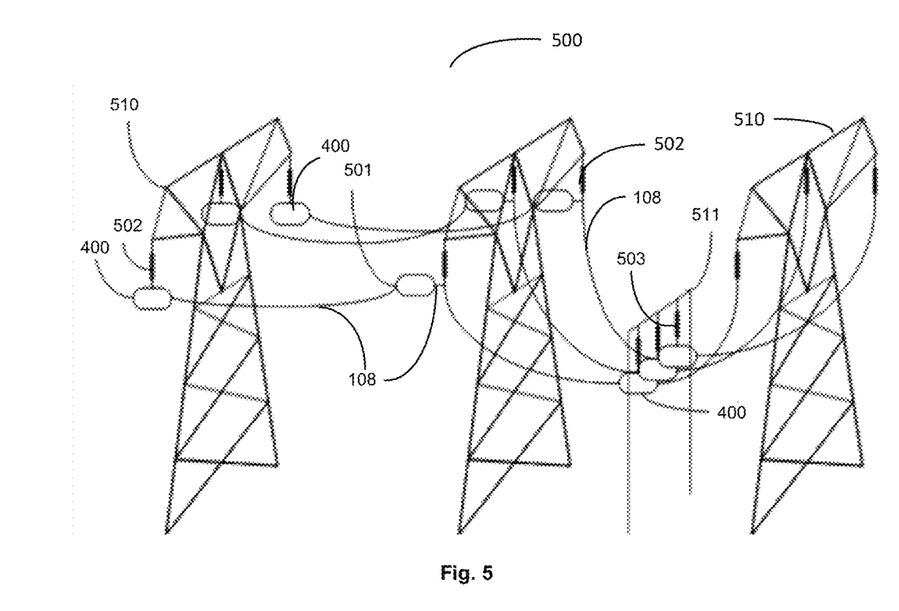
FIG. 5 is a representation of a high voltage transmission line showing various ways the distributed active impedance injection modules are to be supported while being directly attached to the HV-transmission lines and operating at line voltage as per the embodiments of the invention.

It should be understood that all the associated circuits of the module are enclosed in a housing, which is suspended insulated from ground at the HV transmission line voltage. Due to weight considerations it is preferable to have these modules suspended from the towers or provide additional support for their safe attachment. FIG. 5 shows the typical attachment methods 500 possible for supporting the injection modules 400 connected to the HV transmission lines 108. The on-line attachment 501, is the typical prior art attachment used for the static modules, which connects the module to the line directly, with no additional support and lets the line supports take the weight of the module and the line. Though this is acceptable, this type of attachment is not the preferred one for the injection modules 400, of the current invention. The preferred attachment for these impedance injection modules 400, distributed for line balancing over the grid system, are with additional support, directly connected by supporting insulators 502 on the HV transmission towers 510 or by using special support structures 511 with insulated supports 503 for providing the additional weight carrying capability for the distributed module. The above support methods also improve the reliability of the structures and system during extreme climatic disturbances.

Even though the invention disclosed is described using specific implementation, it is intended only to be exemplary and non-limiting. The practitioners of the art will be able to understand and modify the same based on new innovations and concepts, as they are made available. The invention is intended to encompass these modifications.

Thus the present invention has a number of aspects, which aspects may be practiced alone or in various combinations or sub-combinations, as desired. Also while certain preferred embodiments of the present invention have been disclosed and described herein for purposes of exemplary illustration and not for purposes of limitation, it will be understood by those skilled in the art that various changes in form and detail may be made therein without departing from the spirit and scope of the invention.

What is claimed is:

1. An apparatus for injecting a voltage or impedance in series with a high-voltage transmission line comprising:
    an injection module having;
        an injection transformer having a multiple-turn primary winding and a multiple-turn secondary winding on a non-gapped core, the primary winding being adapted for connection in series with the high-voltage transmission line by being directly attached to the high-voltage transmission line and by cutting the high-voltage transmission line and splicing respective ends of the primary winding in series with the high-voltage transmission line, wherein the injection transformer is suspended and insulated from ground at the high-voltage transmission line during operation;
        the secondary winding being connected to a converter, and having a virtual ground established at the high-voltage transmission line by connecting one end of the second winding to the high-voltage transmission line;
        the converter being coupled to a controller for controlling the controller; and
        the secondary winding being connected across a bypass switch for providing protection to connected circuits coupled to the secondary winding.

2. The apparatus of claim 1 wherein the injection module is contained in a housing supported by the high-voltage transmission line, a transmission line tower, or a special purpose tower.

3. The apparatus of claim 2 wherein the housing is insulated from ground and is also virtually grounded to the high-voltage transmission line.

4. The apparatus of claim 1 wherein the number of turns in the primary winding is selected to reduce the operating voltage of circuitry connected to the secondary winding, and to increase the coupling to the high-voltage transmission line.

5. The apparatus of claim 4 wherein the number of turns in the secondary winding is selected to reduce the operating voltage of circuitry connected to the secondary winding and to allow use of off-the-shelf power electronic components.

6. The apparatus of claim 4, wherein the apparatus is enabled to inject any of an inductive or a capacitive impedance generated by the injection module on to the high-voltage transmission line, via the injection transformer, for line balancing and control of power transfer.

7. The apparatus of claim 1 wherein the injection module is contained in a housing, the housing being supported by the high-voltage transmission line, a transmission line tower or a special-purpose tower, the apparatus being insulated from its support.

8. The apparatus of claim 1 wherein the modules are also virtually grounded to the high-voltage transmission line.

9. The apparatus of claim 1, wherein power for operation of the apparatus is extracted from the power transmitted over the high-voltage transmission line.

10. The apparatus of claim 9, wherein the power for operation of the apparatus is extracted from the high-voltage transmission line using a current transformer.

11. An active impedance injection module for distributed dynamic line balancing and power flow control over a high-voltage grid system, the active impedance injection module comprising:
    a transformer having an un-gapped transformer core, the un-gapped transformer core having one or more multiple-turn primary winding and at least one multiple-turn secondary winding thereon;
    a converter coupled to each of the secondary windings; and
    a controller coupled to the converter;
    wherein the transformer, the converter and the controller are all housed in a single housing forming the active impedance injection module for suspending on a high-voltage power line of the grid system;
    wherein the active impedance injection module is suspended from the high-voltage power line by cutting the high-voltage power line into two cut ends and splicing two ends of the multiple-turn primary winding to the two cut ends of the high-voltage power line, thereby suspending the active impedance injection module on the high-voltage power line for operation and isolating the active impedance injection module from ground at a line voltage of the high-voltage power line.

* * * * *